United States Patent [19]

Takayama et al.

[11] Patent Number: 4,766,417
[45] Date of Patent: Aug. 23, 1988

[54] AUTOMATIC OFFSET COMPENSATING BIPOLAR A/D CONVERTER CIRCUIT

[75] Inventors: Jun Takayama, Tokyo; Takeshi Ninomiya, Kanagawa, both of Japan

[73] Assignee: Sony Corporation, Tokyo, Japan

[21] Appl. No.: 55,849

[22] Filed: Jun. 1, 1987

[30] Foreign Application Priority Data

Jun. 7, 1986 [JP] Japan ............................. 61-132205

[51] Int. Cl.[4] ............................................. H03M 1/06
[52] U.S. Cl. ....................... 340/347 CC; 340/347 AD
[58] Field of Search .................. 340/347 CC, 347 AD

[56] References Cited

U.S. PATENT DOCUMENTS

| | | | |
|---|---|---|---|
| 3,953,805 | 4/1976 | Couvillon | 340/347 CC U X |
| 4,186,384 | 1/1980 | Acker | 340/347 AD |
| 4,353,060 | 10/1982 | Endoh | 340/347 AD |
| 4,380,005 | 4/1983 | Debord | 340/347 AD |
| 4,602,374 | 7/1986 | Nakamura | 340/347 CC |

Primary Examiner—Charles D. Miller
Attorney, Agent, or Firm—Lewis H. Eslinger; Jay H. Maioli

[57] ABSTRACT

An automatic offset compensating bipolar A/D converter circuit includes an A/D converter and a feedback circuit, which automatically compensates offset error between a specific level of input having analog voltage and a specific output code of output digital value corresponding to that input analog voltage. The A/D converter can convert the input analog voltage, which includes residual noises more than 1 LSB, into an output digital value. The feedback circuit can add a compensation voltage to the input analog voltage so as to equalize the posibilities of occurrence of codes which are more than and less than a specific output code of an output digital value to each other in accordance with an output digital value.

6 Claims, 5 Drawing Sheets

| | J | K | Q |
|---|---|---|---|
| POSITIVE CODE (MSB = 0) | 1 | 0 | 1 |
| NEGATIVE CODE (MSB = 1) | 0 | 1 | 0 |
| ZERO CODE (MSB = 0) | 0 | 0 | Q-1 |

AUTOMATIC OFFSET COMPENSATING BIPOLAR A/D CONVERTER CIRCUIT

BACKGROUND OF THE INVENTION

1. Field of the Invention

The present invention relates to an automatic offset compensating bipolar A/D converter circuit. More specifically, the invention relates to an A/D converter circuit which can delete offset error between a specific code of digital output and the analog voltage corresponding to the digital output.

2. Description of the Prior Art

A bipolar A/D converter has an input-output characteristic which is theoretically symmetrical about the origin. However, conventional bipolar A/D converters have a so-called offset error by which the input analog voltage is not 0 V when the digital output has zero value (0-------0). In order to eliminate the offset error, the MSB's or sign bits of binary codes expressed by 0 and 1, such as offset binary or 2' complement, are integrated to eliminate the offset error on the average in conventional bipolar A/D converters.

The aforementioned method is effective to compensate offset error which is caused by a comparator in a converter or by offset of reference voltage to approach zero. However, it is difficult to perfectly compensate ½LSB offset error, which is caused according to height of the quantizing step, to approach zero.

SUMMARY OF THE INVENTION

It is therefore a principal object to eliminate the aforementioned disadvantage of prior art systems and to provide an automatic offset compensating bipolar A/D converter circuit which can perfectly compensate offset error.

In order to accomplish the aforementioned object and other specific objects, an automatic offset compensating bipolar A/D converter circuit, according to the present invention, includes an A/d converter and a feedback circuit, which automatically compensates offset error between a specific level of input analog voltage and a specific output code of output digital value corresponding to the input analog voltage. According to the present invention, the A/D converter can convert the input analog voltage, which includes residual noises of more than 1LSB, into an output digital volume. In addition, the feedback circuit can add a compensation voltage to the input analog voltage so as to make the possibilities of occurrence of codes, which are more than or less than a specific output code voltage, equal to each other in accordance with an output digital value.

According to the preferred embodiment of the invention, the specific level is the zero value code of the input analog voltage and the specific output code is the zero code. In addition, the feedback circuit is provided with an integrator which integrates MSB's (sign bits) of the output codes except for the zero value code and wherein the integrated output is returned to the input analog voltage. Alternatively, the feedback circuit can also be provided with a hysteresis circuit, in which transition points are disposed at +1LSB being 1bit more then the zero value code and at −1LSB being 1 bit less than the zero value code, and an integrator which integrates the output produced from the hysteresis circuit, so as to return the integrated output to the input analog voltage.

BRIEF DESCRIPTION OF THE DRAWINGS

The present invention will be understood more fully from the detailed description given herebelow and from the accompanying drawings of the preferred embodiment of the invention. The drawings are not intended to imply limitation of the invention to this specific embodiment, but are for explanation and understanding only.

In the drawings.

DESCRIPTION OF THE PREFERRED EMBODIMENT

Figure 1:
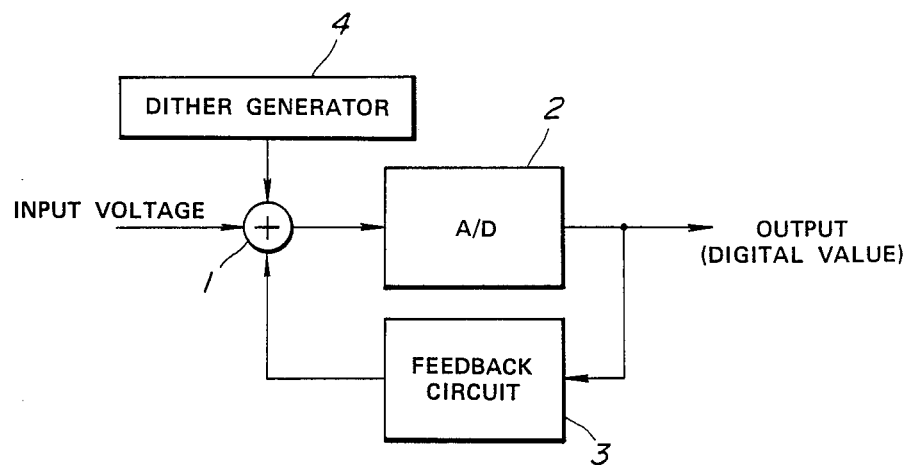
FIG. 1 is a schematic block diagram of the preferred embodiment of an automatic offset compensating A/D converter circuit according to the present invention.

Referring now to the drawings, particularly to FIG. 1, an A/D converter circuit includes an adder 1, an A/D converter 2 and a feedback circuit 3. Input analog voltage is supplied to the A/D converter 2 via the adder 1 so as to produce output digital signals. The output digital signals are supplied to the feedback circuit 3 to supply an offset compensating voltage to the adder 1. If necessary, dither signals (noises) are supplied to the adder 1 by means of a dither generator 4 to superimposed on the input voltage so that the offset compensating system can stably actuate. However, when some residual noises are included in the input voltage, overlap of the dither signal is not required.

The A/D converter 2 may be any one of various conventional converters. If necessary, a sample-and-hold circuit, an anti-aliasing filter and so forth may be provided in the converter 2.

The feedback circuit 3 returns an average value, which is formed by positive and negative codes in the binary codes of digital output sampled for a long period of time, to the input of the adder 1 so that the probabilities of occurrence of the positive and negative codes are equal to each other, thereby allowing the average to be zero. In this case, the long period of time is much longer than the period of the lowest frequency of the input analog signal.

Figure 3:
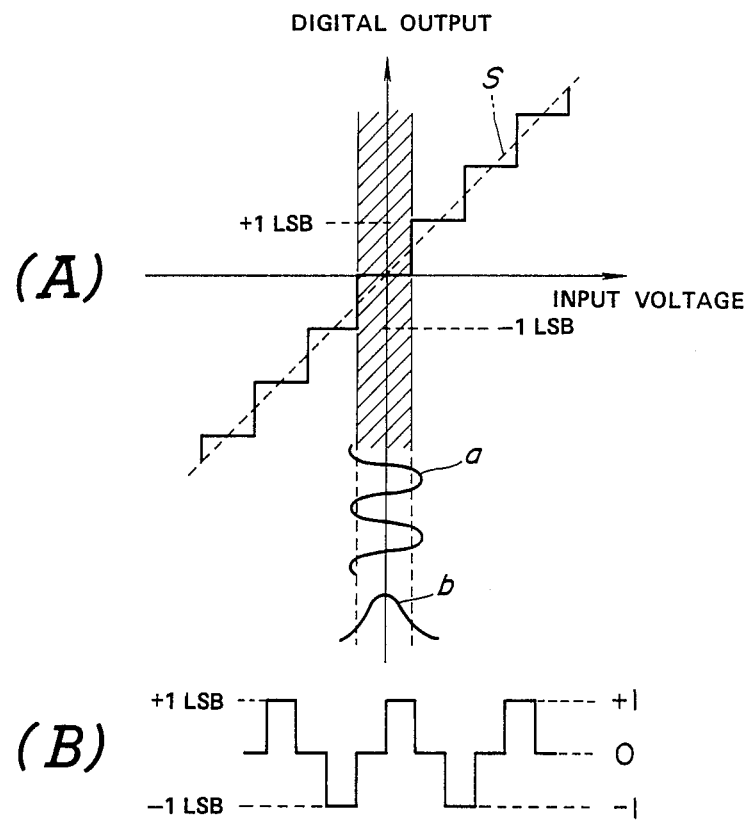
FIG. 3(A) is a graph showing an input-output characteristic of the circuit in FIG. 1.
FIG. 3(B) is an output time chart of the circuit in FIG. 1.

Offset binary or 2's complement or the combination thereof, which is generally used as the output code of an A/D converter 2, has only one zero value code. Therefore, as shown in input-output graph of FIG. 3(A), there is a dead zone at a location (the slant line section) corresponding to the zero value code of digital output with respect to offset compensation. The feedback circuit 3 controls the input DC voltage so that the probabilities of occurrence of positive and negative codes on both sides of the dead zone are equal to each other. Therefore, since positive and negative codes are not produced when the input level is perfectly zero, the position of the origin of conversion characteristic line S (dotted line) can be determined within one quantization step ($\pm\frac{1}{2}$LSB) according to the dead zone.

In cases where any residual noises are larger than the dead zone when input is zero, some codes (+1LSB, −1LSB) other than zero value are steadily produced. Since the feedback circuit 3 operates so that the number of codes above or below zero value are equal, the system is stable when the origin of the conversion characteristic line S coincides with the zero level of input voltage (offset error is zero) as shown in FIG. 3(A). In this case, +1LSB, 0, −1LSB of digital output values are reciprocally produced as shown in FIG. 3(B). The long-term average of +1LSB=1 and −1LSB=−1 is zero. If a pair of values are increased, a DC voltage is supplied to the adder 1 by means of the feedback circuit 3 to compensate it.

When the residual noise included in the input analog signals is within $\pm\frac{1}{2}$LSB, for example, a Gaussian dither noise may be supplied by means of the dither generator 4 as shown in FIG. 3(A). Furthermore, since quantizing levels are specified by more than 8 bits (256 levels) is consumer and service audio or video apparatus, the residual noises to be treated may be considered to be outside the range of $-\frac{1}{2}$LSB to $+\frac{1}{2}$LSB.

In addition, a hysteresis characteristic may be substituted for the aforementioned dead zone.

Figure 2:
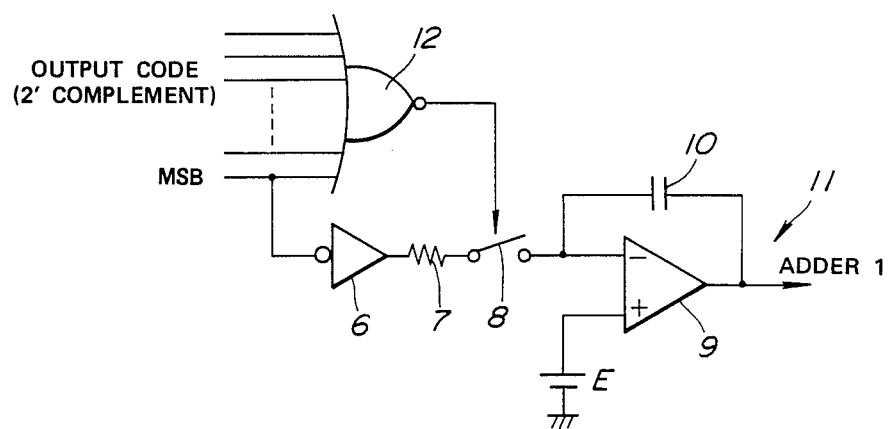
FIG. 2 is a block diagram of the preferred embodiment of a feedback circuit used in the converter circuit of FIG. 1.

The preferred embodiment of a feedback circuit 3, shown in FIG. 1, is shown in FIG. 2. For example, 2's complement output code of an A/D converter 2 is discussed below. The MSB (sign bit) thereof is supplied to an integrating circuit 11, which comprises an operational amplifier 9 and a feedback capacitor 10, by means of an inverter 6, a resistor 7 and switch 8. The integrated output is supplied to the adder 1 shown in FIG. 1 in the form of an error output relative to the + input reference voltage E of the operational amplifier 9, and the output serves as a DC bias.

If the probabilities of the MSB="0" (positive) and the MSB="1" (negative) are equal to each other when the input voltage is zero, the integrated value is about half of the power voltage and is equal to the reference voltage E, and therefore the error output is zero. In this case, the input zero level is equal to the zero value of the output code, so that there is no offset error. For example, when the MSB="0" (positive) is increased, the error output is decreased so that voltage inputted to the A/D converter 2 is decreased. As a result, loop operation is performed so as to increase the MSB="1" (negative).

Output bits of the input codes, other than the MSB, of the A/D converter 2 are supplied to an NOR gate 12 for thereby detecting whether or not all the bits of the output codes are zero. When all the bits of the output codes are zero, the output of the NOR gate 12 becomes "1" so that the switch 8 is opened. That is, when all the bits of the output codes are zero, the MSB ("0") does not serve as an integrated input. Therefore, there is a dead zone corresponding to $+\frac{1}{2}$LSB as shown in FIG. 3(A).

Even though the input voltage is essentially zero, when noises exceeding this dead zone are included, positive, zero, negative, zero and positive values are applied to the output code in the order named as shown in FIG. 3(B). Therefore, the switch 8 is not fixed to be open but instead it reciprocally opens and closes. Therefore, a feedback loop is operated to adjust the bias value so that the probabilities of occurrence of positive and negative codes are essentially 50%, respectively.

Figures 4, 5:
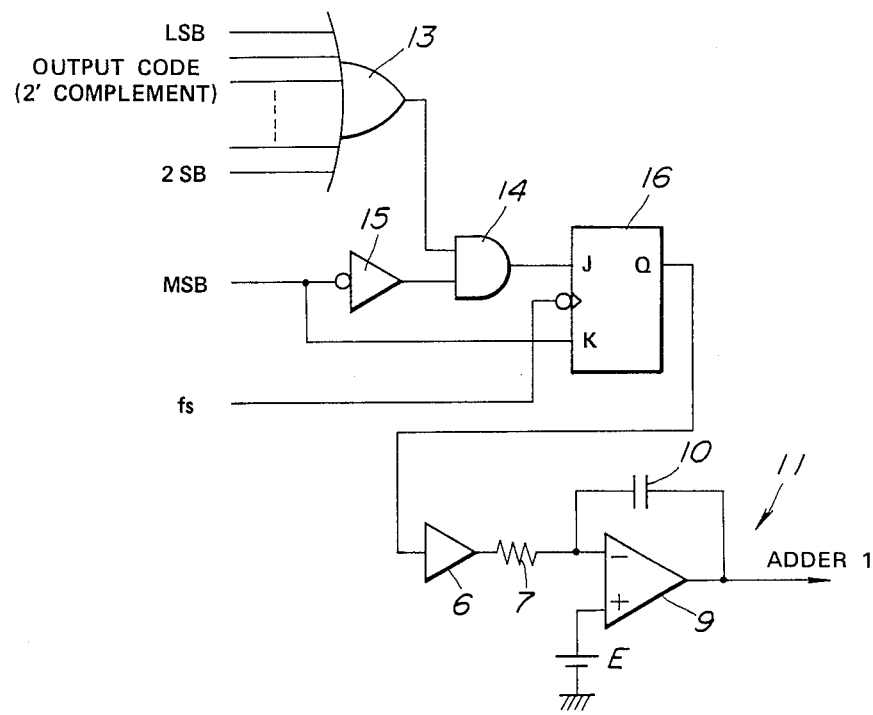
FIG. 4 is a block diagram of the another preferred embodiment of a feedback circuit used in the converter circuit of FIG. 1.
FIG. 5 is a table of truth values of the circuit in FIG. 4.

FIG. 4 shows another preferred embodiment of a feedback circuit 3 shown in FIG. 1, the feedback characteristic of which has hysteresis. The 2's complement serving as the output code of the A/D converter 2 is used as in the embodiment of FIG. 3. An OR gate 13 detects whether or not bits less than the MSB (2SB to LSB) include "1" to open an AND gate 14. When the MSB becomes reciprocally "1" and "0", the MSB="0" is changed into "1" by means of an inverter 15 to supply the J input terminal of a flip-flop circuit 16 (FF 16) in order to set the FF 16. The MSB="1" is directly supplied to the K input terminal to reset the FF 16. Therefore, signals corresponding to "1" and "0" are reciprocally outputted from the Q output terminal according to the MSB. These signals are supplied to the integrating circuit 11 by means of the inverter 6 and the resisitor 7 similar to FIG. 3, thereby forming the error output which is returned to the input voltage. Input clock pulses $f_s$ of the A/D converter are sampling clock pulses.

When the output code is zero, 2SB to LSB are "0". Therefore, since the output of the OR gate becomes "0" to close the AND gate 14, FF 16 is not set even when the MSB="0". In addition, since the K input terminal is "0", the FF 16 is not reset.

Figure 6:
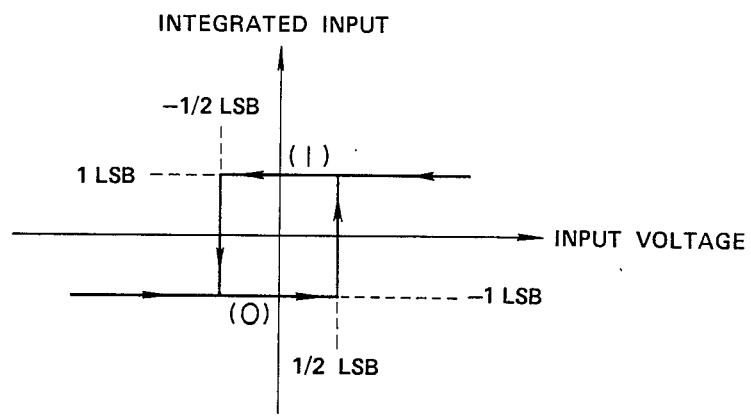
FIG. 6 is a graph showing the hysteresis characteristic of the logic circuit in FIG. 4.
Figure 7:
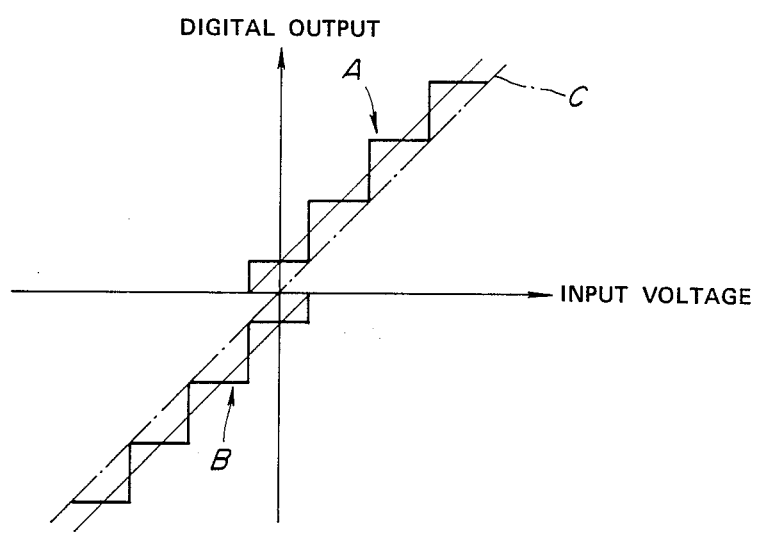
FIG. 7 is a graph showing an A/D conversion characteristic of the feedback circuit in FIG. 4.

FIG. 5 shows a truth table of the logical circuit in FIG. 4. As shown in FIG. 5, when the output code is changed from positive to zero or when it is changed from negative to zero, the Q output of the FF 16 is not inverted, but is held to be the same as the prior condition ($Q_{-1}$). The Q output is first inverted when the output code is changed into positive passing through zero or when it is changed into negative passing through zero. Therefore, the integrated input value has hysteresis characteristics relative to the input voltage as shown in FIG. 6 and the output code zero corresponding to the range of input value $+\frac{1}{2}$LSB is regarded as a positive or negative code. When the output code zero is regarded as positive, the input-output characteristic of the A/D convert is offset by $-\frac{1}{2}$LSB as expressed by the line A in FIG. 7. Conversely, when the output code zero is regarded as positive, the input-output characteristic is offset by $+\frac{1}{2}$LSB as expressed by the line B in FIG. 7.

In cases where noise which exceeds the input range comprising $+\frac{1}{2}$LSB in FIG. 6, is included when the input voltage is essentially zero "1" and "0" are reciprocally produced serving as the integrated input, and thereby error for feedback is zero. Therefore, with respect to conversion characteristics, the zero point of the input corresponds to the zero value of the output as expressed by the line C in FIG. 7 to be offset to zero. When an offset error is produced, integration biased toward "1" or "0" is performed so that the offset compensating DC-bias is added by means of the feedback circuit 3.

Furthermore, according to the present invention, when a DC offset is included in the input voltage, that is, when the digital output is asymmetrical relative to the line in which the input voltage is zero, the operating point of the A/D converter can be moved to a point other than zero according to the DC offset, whereby the dynamic range of the A/D converter can be effectively used. In this case, by means of a specific code of the A/D converting output corresponding to a DC offset of the analog input, the feedback circuit 3 is actuated so that the probability with which a code voltage greater than the specific code is produced is equal to that with which a code voltage less than the specific code. The specific code can have dead zone characteristics similar to FIG. 3 and can also have hysteresis characteristics.

Figure 8:
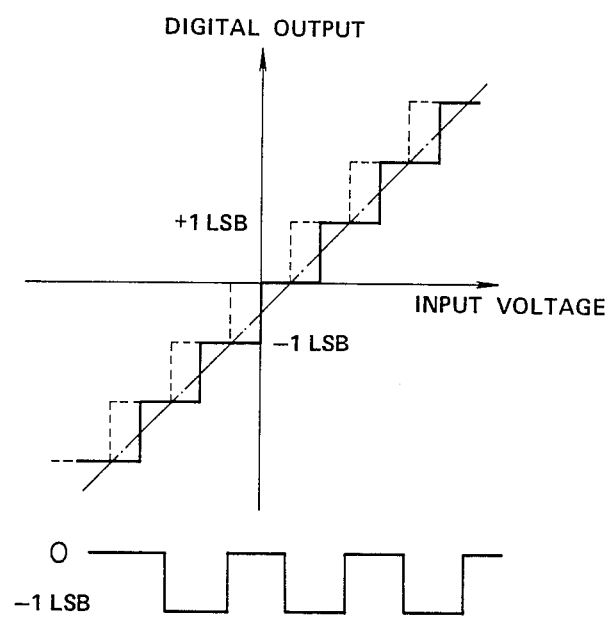

According to the invention, it is possible to perfectly zero ½LSB offset error caused according to the height of the quantiszing levels. That is, if an automatic offset compensating bipolar A/D converter circuit of the invention is not used, offset from the origin by +½LSB occurs even if the relationship between the input voltage and output quantizing level is set so as to be symmetrical about the origin as expressed by the dotted line of the input-output graph in FIG. 8(A). In this case, when input voltage is 0 V, output data reciprocally becomes 0 and −1LSB as shown in FIG. 8(B). In this case, according to offset binary, 2's complement and so forth, any sign bit MSB is positive or negative even if the code is zero value so that DC feedback is performed to equalize the posibilities of zero value and negative or positive 1LSB with each other as shown in FIG. 8B. As a result, offset error corresponding to ½LSB remains. According to the invention, it is possible to perfectly zero such a ½LSB offset error.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. A bipolar A/D converter circuit which automatically compensates an offset error between a specific level of an input analog voltage and a specific output code of output digital value corresponding to said input analog voltage, where said input analog voltage may include residual noise greater than one least significant bit of said output code, comprising:

an A/D converter means for convering an input analog voltage into an output code of corresponding output digital value; and a feedback circuit means for adding a compensation voltage to said input analog voltage so as to equalize the probabilities of occurrence of output codes which are more than, and less than, said specific output code of said output value, respectively, in response to the output digital value, said feedback circuit means including hysteresis circuit means having transistion points of substantially equal magnitude respectively more than and less than said specific output code for returning an output to said input analog voltage.

2. A bipolar A/D converter circuit as set forth in claim 1, wherein said specific level is a zero level of said input analog voltage and said specific output code is a zero value code.

3. A bipolar A/D converter circuit as set forth in claim 2, wherein said feedback circuit means includes integrator means for integrating most significant bits of said output codes except for said zero value code, so as to return an integrated output to said input analog voltage.

4. A bipolar A/D converter circuit as set forth in claim 1, wherein said hysteresis circuit means has transition points at +1LSB and −1LSB respectively more and less than said specific output code.

5. A bipolar A/D converter circuit as set forth in claim 1, wherein said hysteresis circuit means comprises a flip-flop having its set input connected to receive the output from an AND gate whose inputs receive the inverted sign bit (MSB) of the output code and the output of an OR gate whose inputs receive the remaining bits of the output code, and wherein the reset input is connected to receive the sign bit (MSB) of the output code.

6. A bipolar A/D converter circuit as set forth in claim 5, wherein the output of the flip-flop is connected to the input of an integrator means for integrating the flip-flop outputs and returning an integrated output to said input analog voltage.

* * * * *

UNITED STATES PATENT AND TRADEMARK OFFICE
CERTIFICATE OF CORRECTION

PATENT NO. : 4,766,417
DATED : August 23, 1988
INVENTOR(S) : Jun Takayama and Takeshi Ninomiya It is certified that error appears in the above-identified patent and that said Letters Patent is hereby corrected as shown below:

```
In the Abstract, line 6, delete "having".
Column 1, line 21, change "2'" to --2's--;
          lines 48 and 49, change "volume" to --value--.
Column 2, line 44, after "to" insert --be--.
Column 3, line 25, change "is" to --in--;
          line 54, change "input" to --output--;
          line 62, change "+" to --±--.
Column 4, line 41, change "+" to --±--;
          line 50, change "+" to --±--;
          same line, delete ",";
          line 51, after "zero" insert --,--.
Column 5, line 11, change "quantiszing" to --quantizing--.

Column 6, line 13, change "transistion" to --transition--.
```

Signed and Sealed this

Eleventh Day of April, 1989

Attest:

DONALD J. QUIGG

*Attesting Officer*    *Commissioner of Patents and Trademarks*